(12) United States Patent
Nagaoka

(10) Patent No.: US 6,184,731 B1
(45) Date of Patent: Feb. 6, 2001

(54) RESET SIGNAL GENERATION CIRCUIT

(75) Inventor: Hiroshi Nagaoka, Atsugi (JP)

(73) Assignee: Mitsumi Electric Co., Ltd., Tokyo (JP)

( * ) Notice: Under 35 U.S.C. 154(b), the term of this patent shall be extended for 0 days.

(21) Appl. No.: 09/299,890

(22) Filed: Apr. 27, 1999

(30) Foreign Application Priority Data

May 11, 1998 (JP) .................................................. 10-127654

(51) Int. Cl.[7] .................................................. H03L 7/00
(52) U.S. Cl. .......................................... 327/143; 327/198
(58) Field of Search .................................... 327/143, 142, 327/198, 77, 538, 545, 546; 331/185, 186

(56) References Cited

U.S. PATENT DOCUMENTS 5,157,270 * 10/1992 Sakai ...................................... 307/66
5,177,375 * 1/1993 Ogawa et al. ........................ 327/143
5,929,674 * 7/1999 Maccarrone et al. ................ 327/143

* cited by examiner

Primary Examiner—Timothy P. Callahan
Assistant Examiner—Minh Nguyen
(74) Attorney, Agent, or Firm—Ladas & Parry

(57) ABSTRACT

When a voltage of a voltage source increases higher than a predetermined value, a reset signal generation circuit generates a power-on reset signal for a battery charger. In the reset signal generation circuit, power for an output circuit is supplied from a divided point between a voltage source and a ground, which power is stabilized by a voltage stabilizer circuit. Since the power for the output circuit is supplied from the divided point, a fluctuation of the voltage of the power for the output circuit is reduced compared to that of the voltage source. Moreover, the voltage stabilizer circuit prevents an erroneous reset signal for the battery charger from being generated due to the voltage fluctuation of the voltage source.

6 Claims, 4 Drawing Sheets

RESET SIGNAL GENERATION CIRCUIT

BACKGROUND OF THE INVENTION

1. Field of the Invention

The present invention generally relates to a reset signal generation circuit, and more particularly to a reset signal generation circuit in a battery charger, which circuit detects a voltage drop of a voltage source and generates a reset signal.

2. Description of the Related Art

FIG. 1 shows an example of a conventional reset signal generation circuit. Voltage level shift circuits 11 to 16 are cascaded. Each of the voltage level shift circuits 11 to 16 is made up of a pnp transistor Q1, an npn transistor Q2 and a resistor R1 used as a current limiter. In each of the voltage level shift circuits 11 to 16, all of a base and a collector of the pnp transistor Q1 and a base and a collector of the npn transistor Q2 are connected together. An emitter of the pnp transistor Q1 in the voltage level shift circuit 11 is connected to a voltage source Vcc (e.g., a voltage of 24 V). An emitter of the npn transistors Q2 in each of the voltage level shift circuits 11 to 16 is connected to one end of the associated resistor R1. The other end of the resistor R1 in each of the voltage level shift circuits 11 to 15 is connected to an emitter of the pnp transistor Q1 in each of the lower voltage level shift circuits 12 to 16, respectively. The other end of the resistor R1 in the voltage level shift circuit 16 is connected to a ground. The voltage level shift circuits 11 to 16 respectively shift the voltage level.

A base of an npn transistor Q3 is connected to the emitter of the pnp transistor Q1 in the voltage level shift circuit 15 and the collector of the npn transistor Q3 is connected to the voltage source Vcc. A base of an npn transistor Q4 is connected to an emitter of the npn transistor Q3 and a collector of the npn transistor Q4 is connected to the voltage source Vcc. An emitter of the npn transistor Q4 is connected to one end of a resistor R2.

The resistor R2, a resistor R3 and a resistor R4 are cascaded. The other end of the resistor R4 is connected to the ground. A connection point between the resistors R2 and R3 is connected to a non-inverting input terminal of a comparator 18 and a connection point between the resistors R3 and R4 is connected to an inverting input terminal of the comparator 18. An output terminal of the comparator 18 is connected to a base of an npn transistor Q7.

A base of the pnp transistor Q1 in the voltage level shift circuit 11 is connected to bases of both of the pnp transistors Q5 and Q6. An emitter of the pnp transistor Q5 is connected to the voltage source Vcc and a collector of the pnp transistor Q5 is connected to both a collector of the npn transistor Q7 and a base of an npn transistor Q8. An emitter of the pnp transistor Q6 is connected to the voltage source Vcc and a collector of the pnp transistor Q6 is connected to a collector of the npn transistor Q8 and an output terminal 20. Emitters of both of the npn transistors Q7 and Q8 are connected to the ground.

This circuit is connected to, for example, a battery charger for Lithium batteries. Both the voltage source Vcc and the ground in FIG. 1 are commonly connected to those of the battery charger for the Lithium batteries. As a voltage of the voltage source Vcc increases, the electric potential of an emitter of the transistor Q1 in the voltage level shift circuit 15 increases. Then, both of the transistors Q3 and Q4 turn on. When a current through the resistor R3 increases higher than a predetermined value, the output of the comparator 18 changes into a high level, so that the transistor Q7 turns on and therefore the transistor Q8 turns off. At the same time, when the transistor Q1 in the voltage level shift circuit 11 turns on, both of the transistors Q5 and Q6 turn on because they are current mirror transistors of the transistor Q1. As a result, a reset signal of the high level is supplied from the output terminal 20.

Conventionally, when the voltage source Vcc temporarily drops, the output level of the output terminal 20 becomes a low level because the transistors Q1, Q5 and Q6 temporarily turn off due to a base emitter capacitance. FIG. 2 shows a timing chart of a conventional reset signal generation circuit. When the voltage of the voltage source Vcc temporarily drops from, for example, 24 V to 14 V at a time T1 and recovers soon after the voltage is dropped, the voltage between the base and the emitter of the transistor Q6 temporarily drops, as shown with a solid line in FIG. 2, and an electric potential of the base of the transistor Q8 temporarily increases, as shown with an alternate short and long dash line in FIG. 2. Though the reset signal should keep the high level because the starting voltage of the battery charging for the Lithium batteries is about 13 V, the reset signal of the output terminal 20 temporarily drops to a low level, as shown with a broken line in FIG. 2. In other words, the erroneous reset signal is supplied to the battery charger. This results in an erroneous restart of the battery charging.

SUMMARY OF THE INVENTION

It is a general object of the present invention to provide a reset signal generation circuit in which the above disadvantages are eliminated.

A more specific object of the present invention is to provide a reset signal generation circuit which prevents an erroneous reset signal for a battery charger from generating due to a voltage fluctuation of a voltage source.

The above objects of the present invention are achieved by a reset signal generation circuit which generates a power-on reset signal when a voltage of a voltage source has increased higher than a predetermined value, The reset signal generation circuit includes an output circuit which is supplied with power from a divided point between the voltage source and a ground and a voltage stabilizer which stabilizes a voltage of the divided point between the voltage source and the ground. When the voltage of the voltage source increases higher than the predetermined value, the reset signal generation circuit generates the power-on reset signal for a battery charger. In the reset signal generation circuit, the power for the output circuit is supplied from the divided point between the voltage source and the ground, and the voltage of the divided point is stabilized by the voltage stabilizer. Since the power for the output circuit is supplied from the divided point, a fluctuation of the voltage supplied to the output circuit is reduced compared to that of the voltage source. Moreover, the voltage stabilizer circuit prevents an erroneous reset signal for the battery charger from generating due to the voltage fluctuation of the voltage source.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
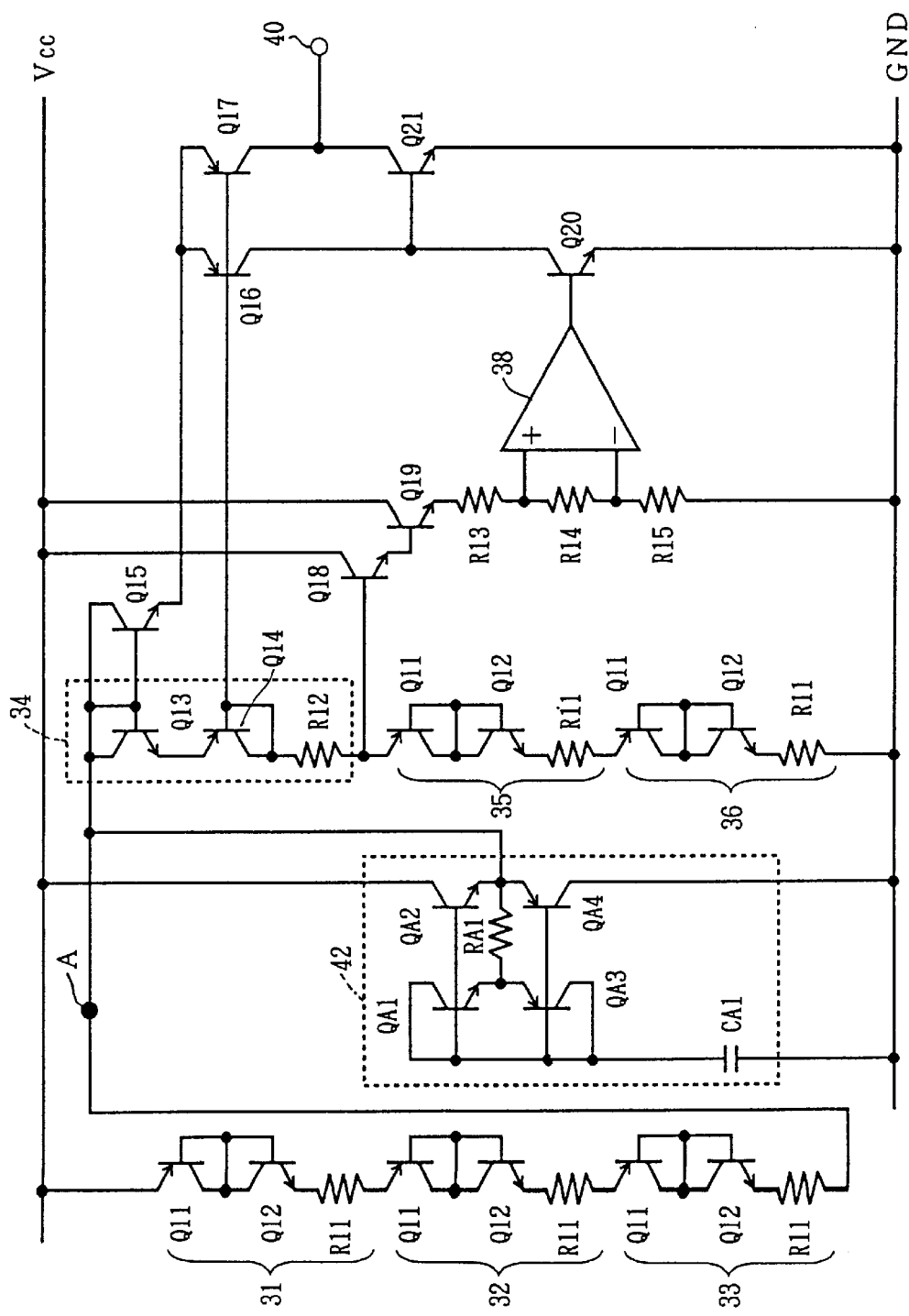
FIG. 3 is a circuit diagram of a reset signal generation circuit according to an embodiment of the present invention.

FIG. 3 shows a circuit diagram of a reset signal generation circuit according to an embodiment of the present invention.

Voltage level shift circuits 31 to 36 are cascaded. Each of the voltage level shift circuits 31, 32, 33, 35 and 36 includes a pnp transistor Q11, an npn transistor Q12 and a resistor R11 used as a current limiter. In each of the voltage level shift circuits 31, 32, 33, 35 and 36, all of a base and a collector of the pnp transistor Q11 and a base and a collector of the npn transistor Q12 are connected together. An emitter of the pnp transistor Q11 in the voltage level shift circuit 31 is connected to a voltage source Vcc (e.g., a voltage of 24 V). An emitter of the npn transistor Q12 in each of the voltage level shift circuits 31, 32, 33, 35 and 36 is connected to one end of the associated resistor R11. The ther end of the resistor R11 in each of the voltage level shift circuits 31, 32 and 35 is connected to an emitter of the pnp transistor Q11 in each of the lower voltage level shift circuits 32, 33 and 36, respectively. The other end of the resistor R11 in the voltage level shift circuit 36 is connected to a ground.

A base and a collector of an npn transistor Q13 are connected to each other. A base and a collector of a pnp transistor Q14 are also connected to each other. The collector of the npn transistor Q13 is connected to the other end of the resistor R11 in the voltage level shift circuit 33. An emitter of the pnp transistor Q13 is connected to an emitter of the pnp transistor Q14. The collector of the pnp transistor Q14 is connected to one end of a resistor R12 (R12=R11) used as a current limiter. The other end of the resistor R12 is connected to an emitter of the pnp transistor Q11 in the voltage level shift circuit 35. The voltage level shift circuits 31 to 36 respectively shift the voltage level.

A connection point "A" between the third voltage level shift circuit 33 counted from the voltage source Vcc and the fourth voltage level shift circuit 34 (i.e., the collector of the npn transistor Q13) is connected to both a base and a collector of an npn transistor Q15. The transistors Q13 and Q15 form a current mirror circuit. An emitter of the npn transistor Q15 is connected to emitters of pnp transistors Q16 and Q17. Bases of the pnp transistors Q16 and Q17 are connected to the base of the pnp transistor Q14. The transistors Q14, Q16 and Q17 also form a current mirror circuit.

An emitter of the pnp transistor Q11 in the fifth voltage level shift circuit 35 counted from the voltage source Vcc is connected to a base of an npn transistor Q18. A collector of the npn transistor Q18 is connected to the voltage source Vcc. An emitter of the npn transistor Q18 is connected to a base of an npn transistor Q19. A collector of the npn transistor Q19 is connected to the voltage source Vcc and an emitter of the npn transistor Q19 is connected to one end of a resistor R13. The resistor R13, a resistor R14 and a resistor R15 are cascaded. The other end of the resistor R15 is connected to the ground. The connection point between the resistors R13 and R14 is connected to a non-inverting input terminal of a comparator 38 and a connection point between the resistors R14 and R15 is connected to an inverting input terminal of the comparator 38. An output terminal of the comparator 18 is connected to a base of an npn transistor Q20.

A collector of the pnp transistors Q16 is connected to a collector of the npn transistor Q20 and a collector of the pnp transistors Q17 is connected to a collector of an npn transistor Q21. A base of the npn transistor Q21 is connected to the collector of the npn transistor Q20. The collector of the npn transistor Q21 is connected to an output terminal 40. Emitters of the npn transistors Q20 and Q21 are connected to the ground. The pnp transistors Q16 and Q17 and the npn transistors Q20 and Q21 form an output circuit.

A voltage of the connection point "A" is Vcc/2 because a magnitude of a voltage level shifted by each of the voltage level shift circuits 31 to 36 is the same voltage value.

As a voltage of the voltage source Vcc increases, an electric potential of the emitter of the transistor Q11 in the voltage level shift circuit 35 increases. Then, both transistors Q18 and Q19 turn on. When a current through the resistor R14 increases higher than a predetermined value, an output of the comparator 38 changes into a high level, so that the transistor Q20 turns on and therefore the transistor Q21 turns off. At the same time, when the transistor Q14 in the voltage level shift circuit 34 turns on, both of the transistors Q16 and Q17 turn on because they are current mirror transistors of the transistor Q14. As a result, a reset signal with a high level (Vcc/2) is supplied from the output terminal 40.

This circuit is connected to, for example, a battery charger for Lithium batteries. Both the voltage source Vcc and the ground in FIG. 3 are commonly connected to those of the battery charger for the Lithium batteries. The high level of the output signal from the output terminal 40 shows that the battery charger should stop its operation of charging.

Next, a voltage stabilizer 42 will be explained. The voltage stabilizer 42 is made up of npn transistors QA1 and QA2 (first and second transistors), pnp transistor QA3 and QA4 (third and fourth transistors), a capacitor CA1 and a resistor RA1. One end of the capacitor CA1 is connected to the ground and the other end of the capacitor CA1 is connected to both bases and both collectors of the npn transistors QA1 and QA3. A base of the npn transistor QA1 is connected to a base of the transistor QA2. The npn transistors QA1 and QA2 together form a current mirror circuit.

An emitter of the npn transistor QA1 is connected to an emitter of the pnp transistor QA3 and one end of the resistor RA1. A collector of the npn transistor QA2 is connected to the voltage source Vcc and an emitter of the npn transistor QA2 is connected to an emitter of the pnp transistor QA4, the other end of the resistor RA1 and the connection point "A". The base of the pnp transistor QA3 is connected to a base of the transistor QA4. The transistors QA3 and QA4 together form a current mirror circuit. A collector of the pnp transistor QA4 is connected to the ground. When a voltage of the connection point "A" is stable at 12 V, a voltage between terminals of the capacitor CA1 is 12V. Therefore, all of the transistors QA1, QA2, QA3 and QA4 is an off state.

When the voltage of the connection point "A" drops, both of the transistors QA1 and QA2 turn on. Then, a current from the capacitor CA1 runs through the emitter of the transistor QA1 and the resistor RA1 to the connection point "A", so that the voltage of the connection point "A" is prevented from dropping. On the other hand, when the voltage of the connection point "A" increases, both of the transistors QA3 and QA4 turn on. Then, a current from the connection point "A" runs through the resistor RA1 and the emitter of the transistor QA3 to the capacitor CA1, so that the voltage of the connection point "A" is prevented from increasing.

Figure 1:
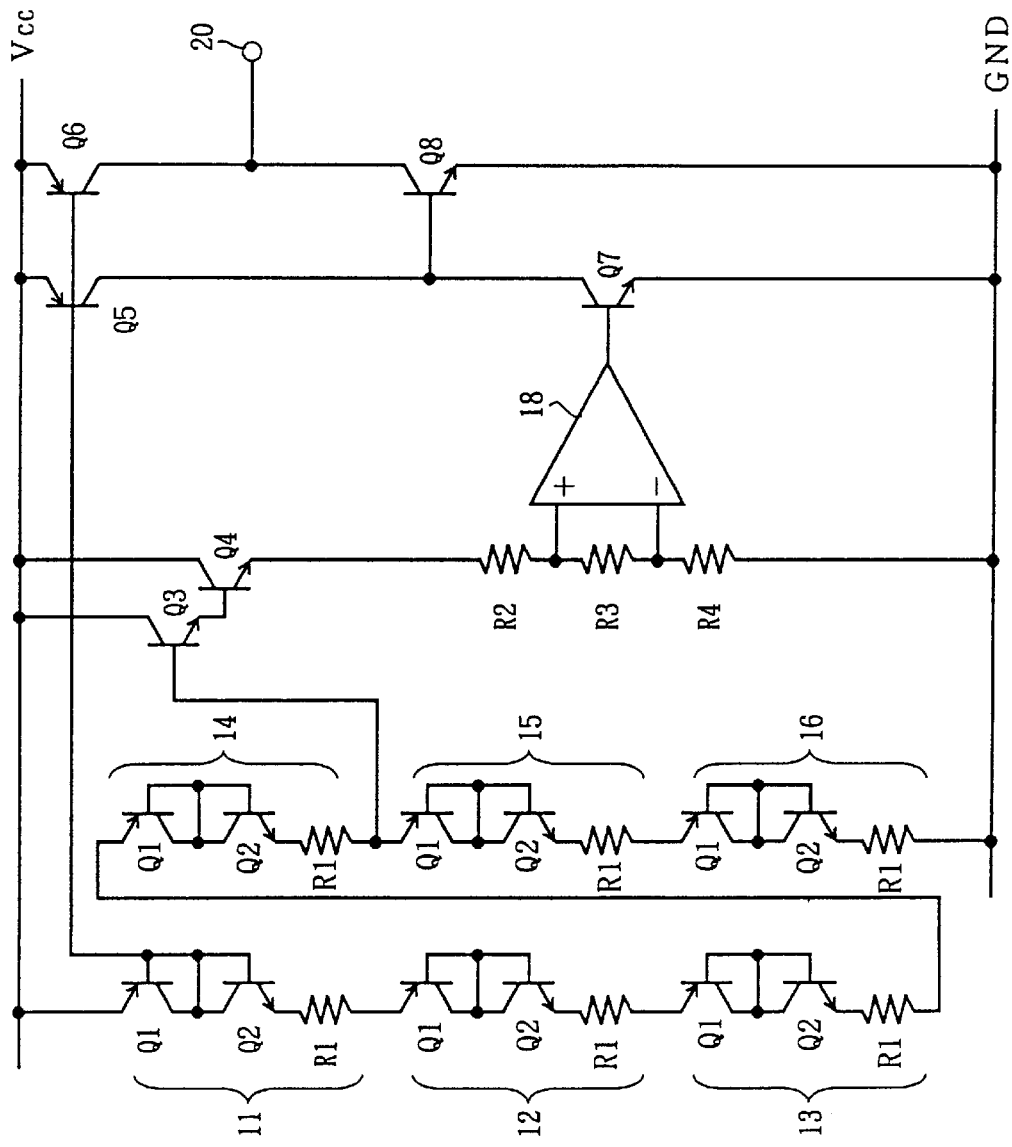
FIG. 1 is a circuit diagram of a conventional reset signal generation circuit.
Figure 2:
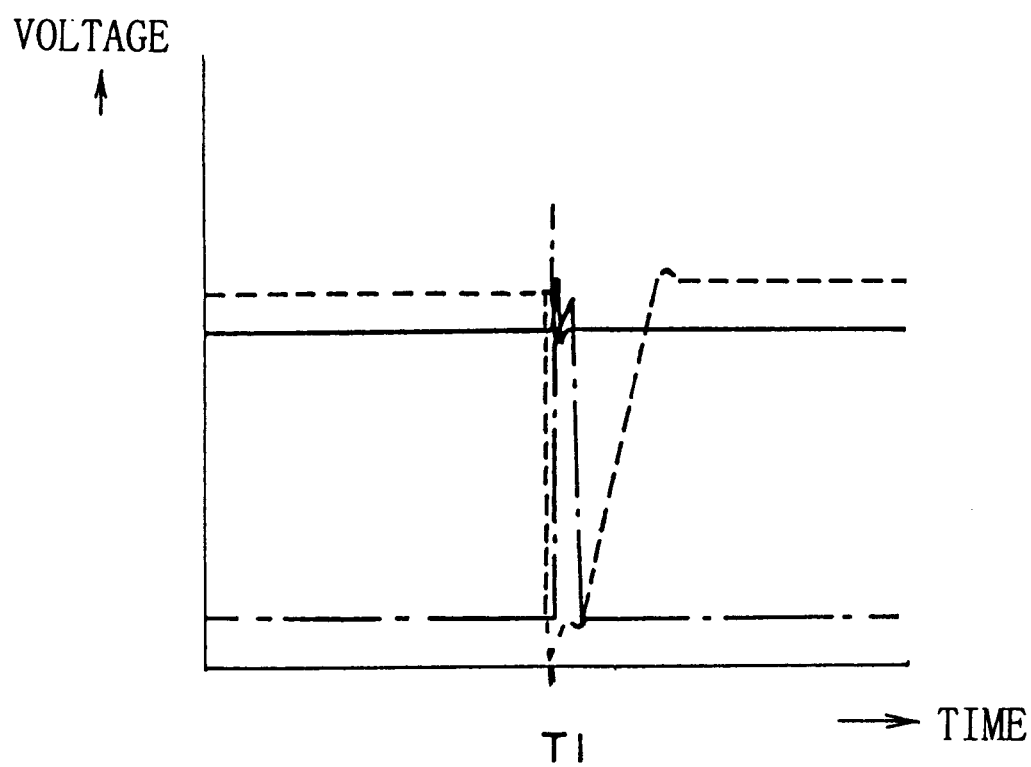
FIG. 2 is a timing chart of the conventional reset signal generation circuit
Figure 4:
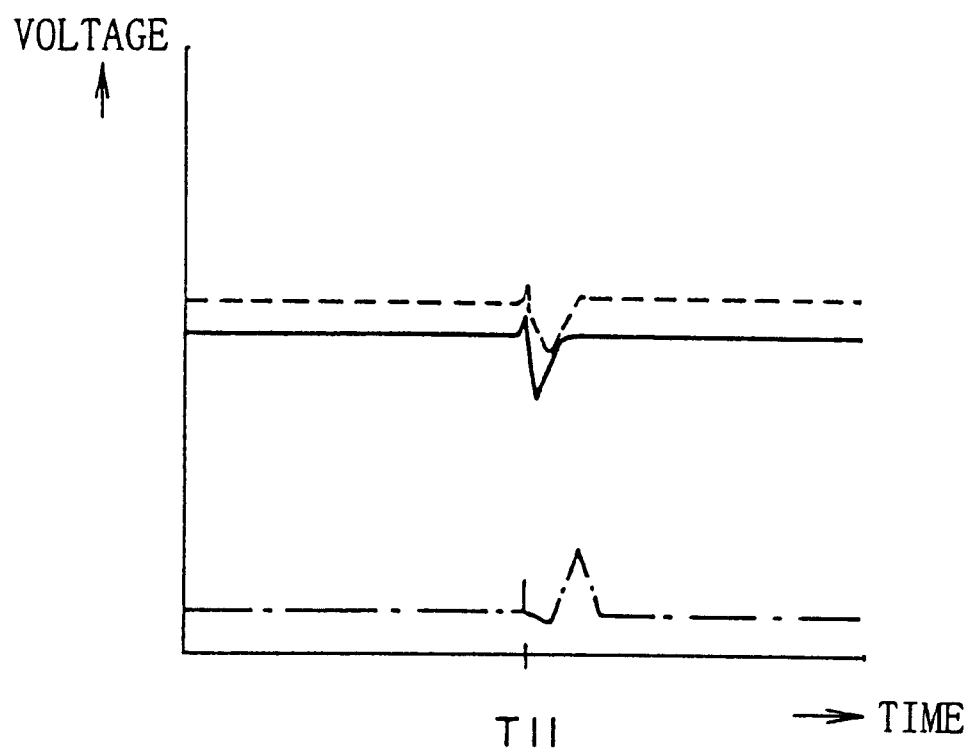
FIG. 4 is a timing chart of the reset signal generation circuit according to the embodiment of the present invention.

For example, FIG. 4 shows a timing chart of the reset signal generation circuit according to the embodiment of the present invention. When the voltage of the voltage source Vcc temporarily drops from, for example, 24 V to 14 V at a time T1 and recovers soon after the voltage is dropped, the voltage of the connection point "A" temporarily drops to 7 V from 12 V because the voltage of the connection point "A" is usually Vcc/2. Therefore, the voltage drop of the connection point "A" is half of that of the voltage source Vcc. Moreover, a voltage fluctuation of the connection point "A" is stabilized by the voltage stabilizer 42. As a result, a voltage between the base and the emitter of the transistor Q17 temporarily drops as shown with a solid line in FIG. 4. However, a magnitude of the voltage drop is reduced compared to that of the conventional circuit shown with a solid line in FIG. 2. Although an electric potential of the base of the transistor Q21 temporarily increases, as shown with an alternate long and short dash line in FIG. 4, the magnitude of the voltage increase is reduced compared to that of the conventional circuit shown with an alternate long and short dash line in FIG. 2. Though the voltage level of the reset signal of the output terminal 40 temporarily drops, as shown with a broken line in FIG. 4, it retains the high level. As a result, an erroneous reset signal is not generated so that a battery charger can be prevented from an erroneous restart of charging.

The present invention is not limited to the specifically disclosed embodiments, and variations and modifications may be made without departing from the scope of the present invention.

The present application is based on Japanese priority application No. 10-127654 filed on May 11, 1998, the entire contents of which are hereby incorporated by reference.

What is claimed is:

1. A reset signal generation circuit which generates a power-on reset signal when a voltage of a voltage source has increased higher than a predetermined value, the reset signal generation circuit comprising:

a power-on reset signal output circuit which is supplied with power from a divided point between said voltage source and a ground; and a voltage stabilizer which stabilizes a voltage of said divided point comprises;

a capacitor;

a first element which turns on when said voltage of said divided point decrease lower than a charged voltage of said capacitor and carries a current from said capacitor to said divided point; and a second element which turns on when said voltage of said divided point increases higher than said charged voltage of said capacitor and carries a current from said divided point to said capacitor.

2. The reset signal generation circuit as claimed in claim 1, wherein said first element is connected between said capacitor and said divided point and carries the current from said capacitor to said divided point when said first element turns on and said second element is connected between said divided point and said capacitor and carries the current from said divided point to said capacitor when said second element turns on.

3. The reset signal generation circuit as claimed in claim 1,

Wherein said first element comprises:

a first npn transistor having a base connected to said capacitor and a collector connected to the base;

a second npn transistor having a base connected to the base of said first npn transistor, a collector connected to the voltage source and an emitter connected to said divided point; and a resistor connected between an emitter of said first npn transistor and the emitter of said second npn transistor, and wherein said second element comprises:

a first pnp transistor having a base and a collector connected to the base of said first npn transistor and an emitter connected to the emitter of said first npn transistor; and;

a second pnp transistor having a base connected to the base of said first pnp transistor, a collector connected to the ground and an emitter connected to the emitter of said second npn transistor.

4. A reset signal generation circuit which generates a power-on reset signal when a voltage of a voltage source has increased higher than a predetermined value, the reset signal generation circuit comprising:

first means, which is supplied with power from a divided point between said voltage source and a ground, for outputting the power-on reset signal; and second means for stabilizing a voltage of said divided point comprises:

a capacitor;

a first element which turns on when said voltage of said divided point decreases lower than a charged voltage of said capacitor and carries a current from said capacitor to said divided point; and a second element which turns on when said voltage of said divided point increases higher than said charged voltage of said capacitor and carries a current from said divided point to said capacitor.

5. The reset signal generation circuit as claimed in claim 4, wherein said first element is connected between said capacitor and said divided point and carries the current from said capacitor to said divided point when said first element turns on and said second element is connected between said divided point and said capacitor and carries the current from said divided point to said capacitor when said second element turns on.

6. The reset signal generation circuit as claimed in claim 4, wherein said first element comprises:

a first npn transistor having a base connected to said capacitor and a collector connected to the base;

a second npn transistor having a base connected to the base of said first npn transistor, a collector connected to the voltage source and an emitter connected to said divided point; and a resistor connected between an emitter of said first npn transistor and the emitter of said second npn transistor, and wherein said second element comprises:

a first pnp transistor having a base and a collector connected to the base of said first npn transistor and an emitter connected to the emitter of said first npn transistor; and a second pnp transistor having a base connected to the base of said first pnp transistor, a collector connected to the ground and an emitter connected to the emitter of said second npn transistor.

* * * * *